(12) United States Patent
Petrescu et al.

(10) Patent No.: US 7,253,631 B2
(45) Date of Patent: Aug. 7, 2007

(54) METHOD OF DETERMINING THE IMPEDANCE OF AN ELECTROCHEMICAL SYSTEM

(75) Inventors: Bogdan Petrescu, Grenoble (FR); Jean-Pierre Petit, Saint Egreve (FR); Jean-Claude Poignet, Saint Martin d'Heres (FR)

(73) Assignee: Institut National Polytechnique de Grenoble, Grenoble (FR)

( * ) Notice: Subject to any disclaimer, the term of this patent is extended or adjusted under 35 U.S.C. 154(b) by 171 days.

(21) Appl. No.: 10/521,216

(22) PCT Filed: Jul. 11, 2003

(86) PCT No.: PCT/FR03/02219

§ 371 (c)(1),
(2), (4) Date: Aug. 4, 2005

(87) PCT Pub. No.: WO2004/008160

PCT Pub. Date: Jan. 22, 2004

(65) Prior Publication Data

US 2006/0091892 A1    May 4, 2006

(30) Foreign Application Priority Data

Jul. 15, 2002    (FR) .................................. 02 08897

(51) Int. Cl.
*H03H 19/00*    (2006.01)

(52) U.S. Cl. ..................... 324/433; 324/430; 702/66; 702/75; 702/57; 702/63; 702/65

(58) Field of Classification Search ................ 324/433, 324/430; 702/66, 75, 57, 77, 76, 89, 98, 702/63
See application file for complete search history.

(56) References Cited

U.S. PATENT DOCUMENTS

| | | | |
|---|---|---|---|
| 5,241,275 A * | 8/1993 | Fang ........................... | 324/430 |
| 5,450,328 A | 9/1995 | Janke et al. | |
| 5,465,287 A | 11/1995 | Egozi | |
| 5,794,334 A * | 8/1998 | Chadbourne et al. ......... | 29/876 |
| 6,002,238 A | 12/1999 | Champlin | |
| 6,037,777 A * | 3/2000 | Champlin .................... | 324/430 |
| 6,172,483 B1 | 1/2001 | Champlin | |
| 6,298,726 B1 * | 10/2001 | Adachi et al. ................. | 73/632 |
| 6,556,001 B1 * | 4/2003 | Wiegand et al. ......... | 324/76.21 |
| 2002/0113569 A1 * | 8/2002 | Iijima et al. ................. | 318/727 |
| 2004/0073390 A1 * | 4/2004 | Wagner et al. ................ | 702/76 |

* cited by examiner

*Primary Examiner*—Karl Easthom
*Assistant Examiner*—Nguyen Tran
(74) *Attorney, Agent, or Firm*—Plevy, Howard & Darcy, PC

(57) ABSTRACT

The invention relates to a method of determining the complex impedance $Z(f_m)$ of a non-steady electrochemical system, comprising the following steps consisting in: bringing the system to a selected voltage condition and applying a sinusoidal signal with frequency $f_m$ thereto; immediately thereafter, measuring successive values for voltage and current at regular time intervals ?T; calculating the discrete Fourier transforms for voltage (E(f)) and current (I(f)), the voltage transform being calculated for the single frequency $f_m$ of the sinusoidal signal and the current transform being calculated for frequency $f_m$ and for two adjacent frequencies $f_{m-1}$ and $f_{m+1}$ on either side of frequency $f_m$; and calculating the impedance using the following formula: $Z(f_m)=E(f_m)/I^*(f_m)$, wherein $I^*$ denotes a corrected current such that $Re[I^*(f_m)]=Re[I^*(f_m)]-(Re[I(f_{m+1})]+Re[I(f_{m-1})]2$, $Im[I^*(f_m)]=Im[I(f_m)]-Im[I(f_{m+1})]+Im[I(f_{m-1})])/2$.

2 Claims, 1 Drawing Sheet

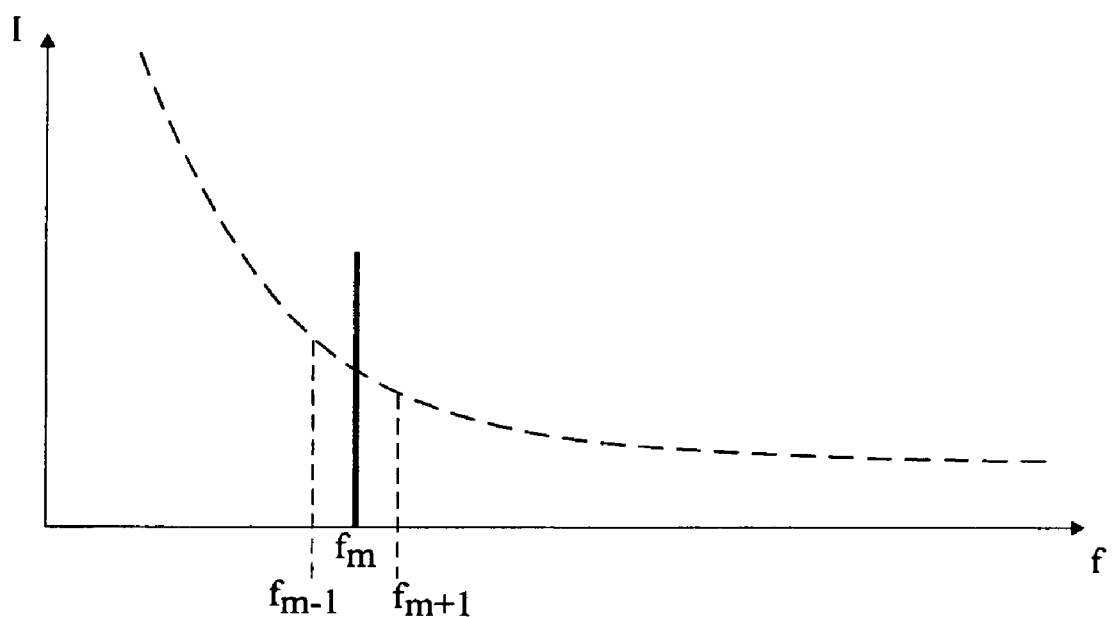
Figure

METHOD OF DETERMINING THE IMPEDANCE OF AN ELECTROCHEMICAL SYSTEM

CLAIM FOR PRIORITY

This application claims the benefit of French Application No. 02/08897, filed Jul. 15, 2002 and Int'l. Application No. PCT/FR2003/002219, filed Jul. 11, 2003 and is incorporated herein by reference.

To determine properties and qualities of an electrochemical system (such as a cell, a battery, an electrodeposition system, a system for analyzing a medium) and predict its future operation, one of the basic parameters is the system's impedance.

Generally, an electrochemical system comprises, in an electrolytic medium, two main electrodes—a work electrode and a back-electrode. A reference electrode is arranged in the vicinity of the work electrode and is used in relation therewith to perform various measurement or regulation operations. In the following, the mentioned voltages and currents correspond to measurements performed between a work electrode and the corresponding reference electrode.

The impedance of an electrochemical system corresponds to the voltage/current ratio. It is known that to rapidly measure the value of this impedance according to frequency, it is desirable to calculate the ratio of the discrete Fourier transforms (DFT) of the voltage and of the current. For this purpose, an excitation signal of small amplitude is applied between a reference electrode and a work electrode of an electrochemical cell, and N successive values e(n) and i(n) of the voltage and of the current, with $1 \leq n \leq N$, are measured at equal time intervals $\Delta T$. The general expression of discrete Fourier transforms $E(f_m)$ and $I(f_m)$ of the voltage and of the current for a sequence of N points is:

$$E(f_m) = \Delta T \sum_{n=1}^{N} e(n)\exp(-2\pi j f_m n \Delta T) \quad (1)$$

$$I(f_m) = \Delta T \sum_{n=1}^{N} i(n)\exp(-2\pi j f_m n \Delta T) \quad (2)$$

where j designates the complex number having −1 as a square, N designates the number of measurement points, $\Delta T$ the sampling interval. The calculation of the discrete Fourier transform may be performed for N/2 values of frequency $f_m$, with $0 \leq m < (N/2)-1$, N being an even number. These N/2 discrete frequencies are regularly distributed between 0 and $1/2\Delta T$ (0 ... $1/m\Delta T$ ... $1/2\Delta T$).

The complex impedance for a given frequency $f_m$ is then equal to:

$$Z(f_m) = E(f_m)/I(f_m). \quad (3)$$

The impedance measurement methods used in practice, mainly differ by the type of excitation signal of the system: sinusoidal, multi-sinusoidal, white noise, etc. A sinusoidal excitation is by far the most widely used, since it appears to be the most accurate. The method consists of imposing a sinusoidal regulation to the electrochemical cell with a signal of small amplitude and of recording the cell current and voltage response. The ratio of the Fourier transforms of the voltage and of the current at the sinus frequency will give the impedance value at this frequency. The frequency spectrum is swept by modifying the excitation frequency.

In the theory of electric systems, the expression of the impedance (equation (3)) is correct, provided that the analyzed system is linear and stationary and that disturbances are not introduced by phenomena external to the system. In the case of electrochemical systems, the fulfilling of these conditions imposes specific precautions. The transfer function of an electrochemical system is generally non-linear but it can be considered as linear over a small portion. This is why a low-amplitude excitation signal is used. Accordingly, the signal-to-noise ratio decreases and the measurement time, that is, the number of measurement points, must be increased to suppress the noise by an integration of the response. However, the lengthening of the measurement time sets problems regarding to the stationarity of the electrochemical system. In many real cases, the stationarity condition cannot be fulfilled. The causes are many: voltage relaxation, current relaxation, concentration relaxation. In such conditions, if the measurement time is sufficiently long to have a good signal-to-noise ratio, the system is not stationary during the measurement time and the calculated impedance has no great meaning any more, especially at low frequencies (for example, smaller than one hertz) where non-stationarity problems are particularly serious.

Various methods have been provided to solve this problem of the non-stationarity of electrochemical systems, but none has yielded a satisfactory solution.

Thus, an object of the present invention is to provide a novel method for calculating the impedance of an electrochemical system enabling ignoring errors linked to the system non-stationarity.

To achieve this object, the present invention provides a method for determining the complex impedance $Z(f_m)$ of a non-stationary electrochemical system, comprising the steps of:

setting the system to a selected voltage state and applying a sinusoidal signal of frequency $f_m$ thereto, measuring, immediately after, successive values of the voltage and of the current at regular time intervals $\Delta T$, calculating the discrete Fourier transforms of the voltage (E(f)) and of the current (I(f)), the voltage transform being calculated for the sole frequency $f_m$ of the sinusoidal signal and the current transform being calculated for frequency $f_m$ and for two adjacent frequencies $f_{m-1}$ and $f_{m+1}$ on either side of frequency $f_m$, and calculating the impedance according to the following formula:

$$Z(f_m)=E(f_m)/I^*(f_m)$$

where I* designates a corrected current such that:

$$Re[I^*(f_m)]=Re[I(f_m)]-\{Re[I(f_{m+1})]+Re[I(f_{m-1})]\}/2.$$

$$Im[I^*(f_m)]=Im[I(f_m)]-\{Im[I(f_{m+1})]+Im[I(f_{m-1})]\}/2.$$

A specific embodiment of the present invention will be non-limitingly discussed in relation with the appended drawing which shows the amplitude spectrum according to the frequency of an electrochemical system submitted to a sinusoidal excitation of small amplitude and to a voltage step.

It should first be noted that, since the applied voltage is imposed by the analysis tool, the system non-stationarity can only appear as current variations.

The present invention is based on the analysis of the behavior of an electrochemical system submitted to a voltage step. The DFT of the current response mainly translates relaxation phenomena and thus the effect of the system non-stationarity. As shown by the curve in dotted lines on the single drawing, the spectrum of amplitude I of the unit of the current DFT usually exhibits a strong low-frequency response to voltage steps.

Conversely, the response to a sinusoidal excitation of frequency $f_m$ of a stationary system translates as a single line at frequency $f_m$. In practice, this response corresponds on the one hand to the system response to the excitation at frequency $f_m$, and on the other hand to the contribution of relaxation effects.

The advantage of the use of the Fourier transform is that the single-frequency spectrum linked to the sinusoidal excitation is superposed to the spectrum linked to the voltage step.

According to the present invention, once the above considerations have been taken into account, it is provided to subtract from the intensity response at frequency $f_m$ the contribution due to relaxations, evaluated based on the analysis of the DFT at frequencies adjacent to $f_m$. Indeed, the Fourier transform for frequencies $f_{m-1}$ and $f_{m+1}$ of the system will only correspond to non-stationarity phenomena and it will be considered that the amplitude value linked to non-stationarities for a frequency $_{fm}$ is the average of the values for the two adjacent frequencies.

Thus, the present invention provides:
- setting an electrochemical system to a selected voltage state and applying a single-frequency sinusoidal excitation thereto,
- measuring, without waiting for the system stabilization, the amplitude of the current and of the voltage at regular intervals immediately after application of the voltage while the sinusoidal excitation is applied, and
- calculating, on the one hand, the discrete Fourier transform of the voltage for frequency $f_m$ of the excitation and on the other hand the DFT of the current for value $f_m$ and for two frequencies $f_{m-1}$ and $f_{m+1}$ adjacent to frequency $f_m$, and
- calculating the value of the complex impedance at frequency $f_m$ based on the value of the TFD of the voltage for frequency $f_m$ and on a corrected value of the TFD of the current, taking into account the TFDs calculated for frequencies $f_{m-1}$, $f_m$, and $f_{m+1}$.

Corrected amplitude I* of the discrete Fourier transform of the current will be calculated in real value and in imaginary value by the two following equations:

$$Re[I^*(f_m)] = Re[I(f_m)] - \{Re[I(f_{m+1})] + Re[I(f_{m-1})]\}/2$$

$$Im[I^*(f_m)] = Im[I(f_m)] - \{Im[I(f_{m+1})] + Im[I(f_{m-1})]\}/2.$$

The value of the impedance corrected with the non-stationarity effects then is:

$$Z(f_m) = E(f_m)/I^*(f_m)$$

with $I^*(f_m) = Re[I^*(f_m)] + jI_m[I^*(f_m)]$

As soon as the reading of the points is performed for frequency $f_m$, a sinusoidal signal can be applied to a new frequency and a new reading can be performed, and so on.

An advantage of the present method is that it makes a correct impedance analysis on non-stationary electrochemical systems possible, especially at very low frequencies. At the same time, a considerable time gain is obtained for systems which stabilize slowly since with the correction according to the present invention, it is no longer necessary to wait for the stabilization after powering-on of the system to start an impedance analysis.

The invention claimed is:

1. A method for determining the complex impedance $Z(f_m)$ of a non-stationary electrochemical system, characterized in that it comprises the steps of:
    setting the system to a selected voltage state and applying a sinusoidal signal of frequency $f_m$ thereto,
    measuring, immediately after, successive values of the voltage and of the current at regular time intervals $\Delta T$,
    calculating the discrete Fourier transforms of the voltage (E(f)) and of the current (I(f)), the voltage transform being calculated for the sole frequency $f_m$ of the sinusoidal signal and the current transform being calculated for frequency $f_m$ and for two adjacent frequencies $f_{m-1}$ and $f_{m+1}$ on either side of frequency $f_m$, and
    calculating the impedance according to the following formula:

$$Z(f_m) = E(f_m)/I^*(f_m)$$

where I* designates a corrected current such that:

$$Re[I^*(f_m)] = Re[I(f_m)] - \{Re[I(f_{m+1})] + Re[I(f_{m-1})]\}/2$$

$$Im[I^*(f_m)] = Im[I(f_m)] - \{Im[I(f_{m+1})] + Im[I(f_{m-1})]\}/2.$$

2. The method of claim 1, characterized in that it is repeated for a succession of excitation frequencies.

* * * * *